United States Patent [19]

Durney

[11] 4,136,444
[45] Jan. 30, 1979

[54] SEMIAUTOMATIC SOLID CHIP REMOVAL APPARATUS

[75] Inventor: David J. Durney, Holland, Pa.

[73] Assignee: Burroughs Corporation, Detroit, Mich.

[21] Appl. No.: 803,512

[22] Filed: Jun. 6, 1977

[51] Int. Cl.² .............................................. B23P 19/00
[52] U.S. Cl. ..................................... 29/764; 219/230; 228/19; 228/264
[58] Field of Search ................ 29/764, 762, 740, 741, 29/739, 626; 219/85 D, 230, 221; 228/19, 20, 22, 264

[56] References Cited

U.S. PATENT DOCUMENTS

| | | | |
|---|---|---|---|
| 3,644,980 | 2/1972 | Class, Jr. | 29/762 X |
| 3,731,866 | 5/1973 | Mason | 29/762 X |
| 4,022,370 | 5/1977 | Durney | 219/85 D X |

*Primary Examiner*—Carl E. Hall
*Attorney, Agent, or Firm*—Carl Fissell, Jr.; Kevin R. Peterson

[57] ABSTRACT

The present invention relates to portable, semiautomatic apparatus for aligning and removing solid state multicontact electrical circuit devices, e.g. DIP (dual-in-line package) chips from printed circuit panels or boards so as to prepare the board for new or replacement chip insertion and soldering.

7 Claims, 13 Drawing Figures

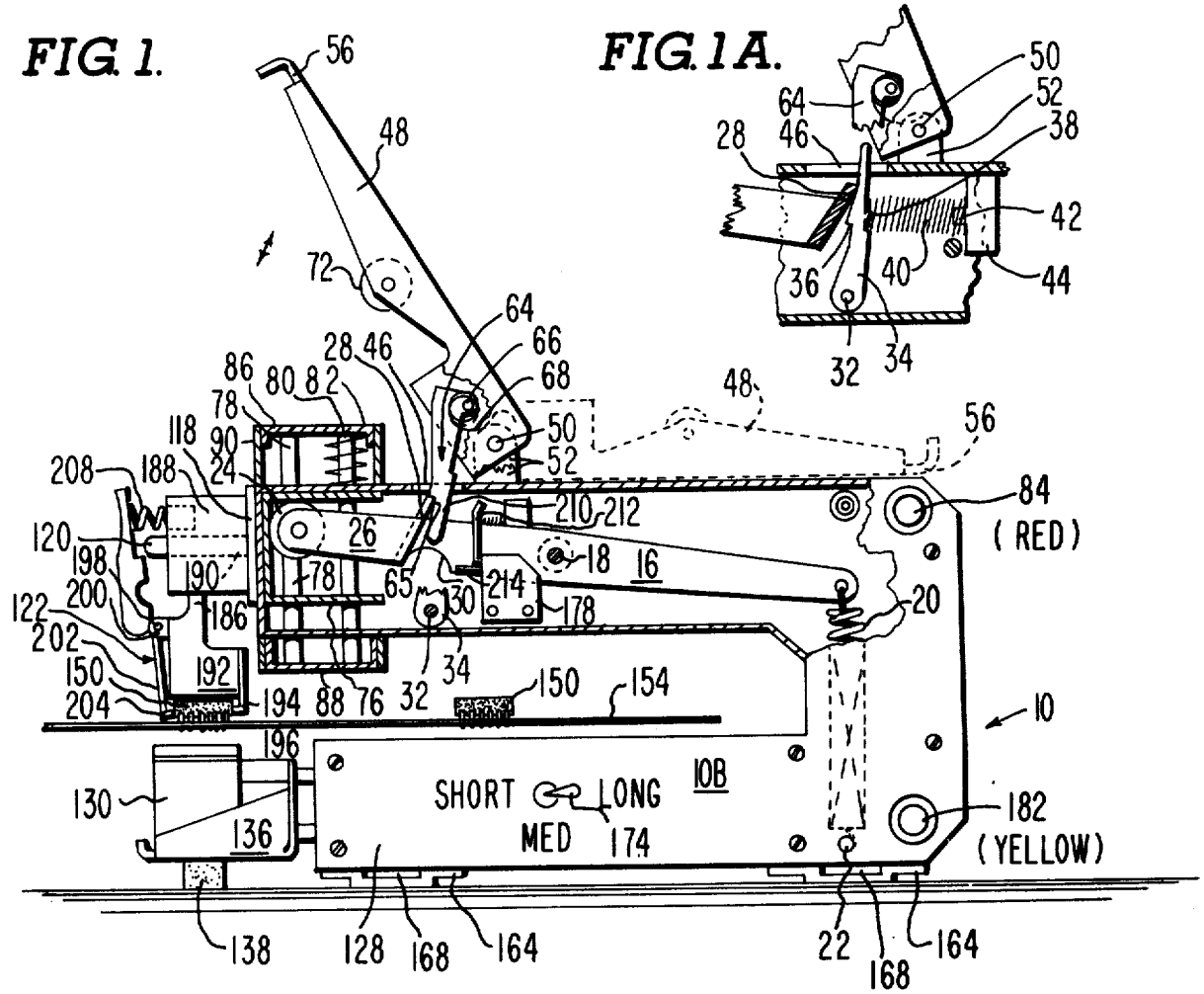

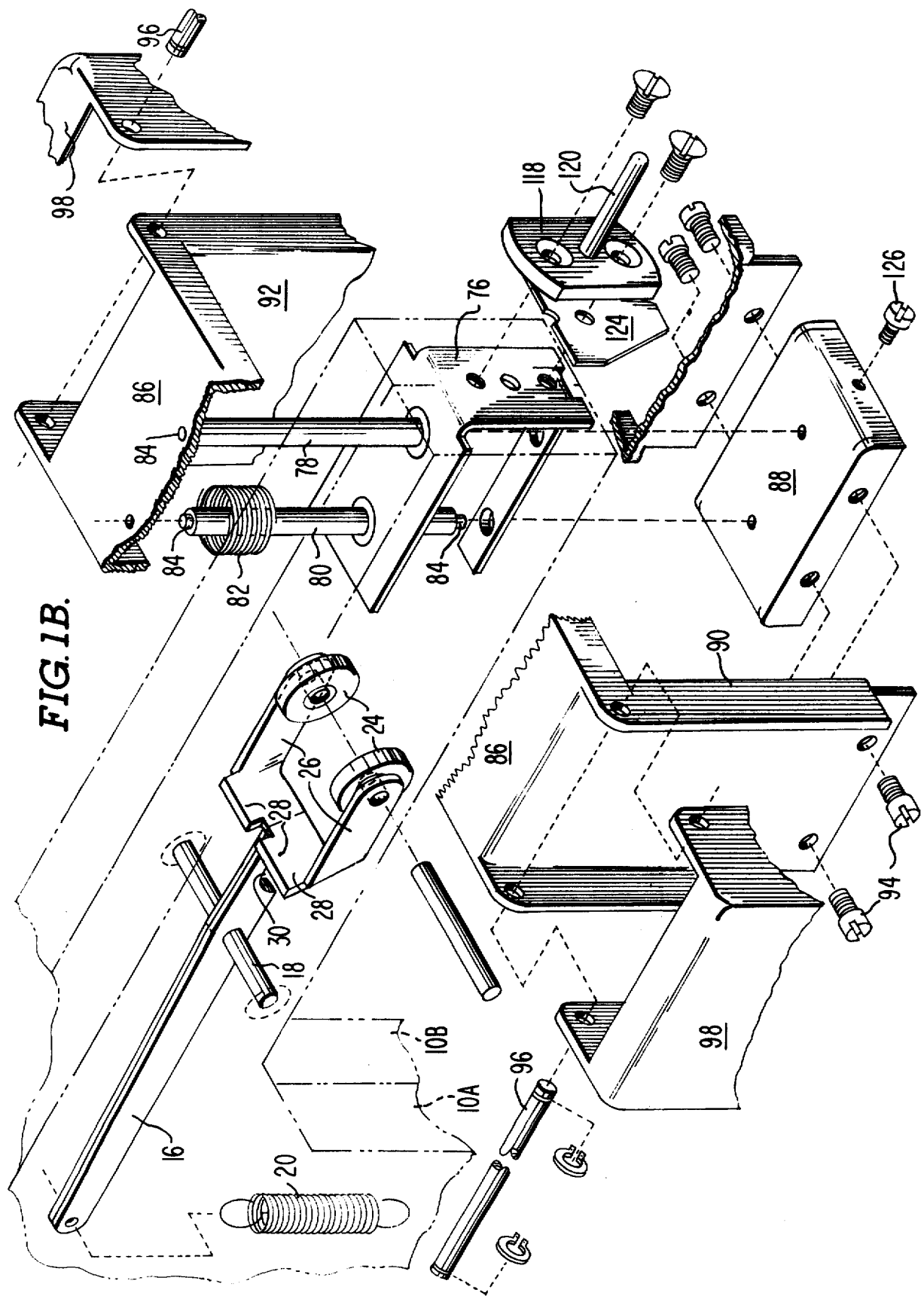

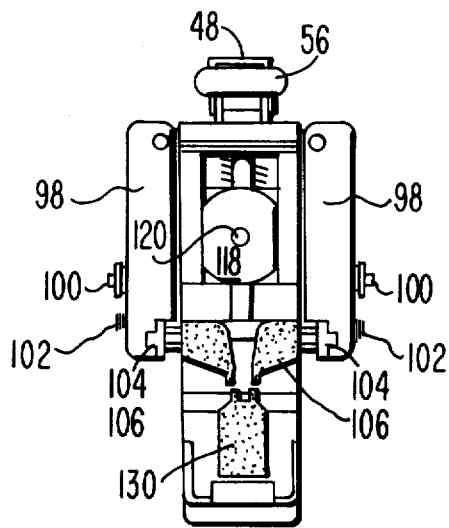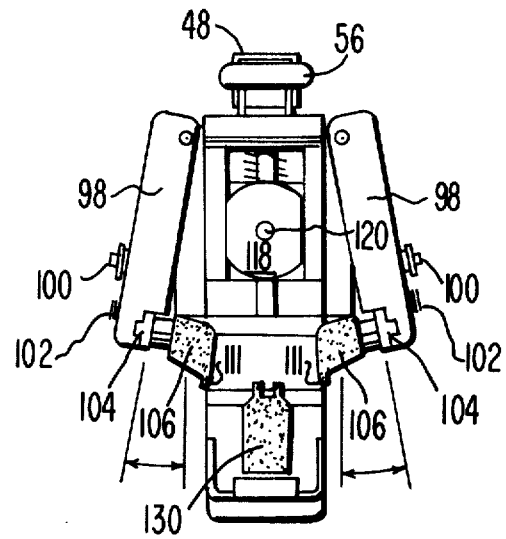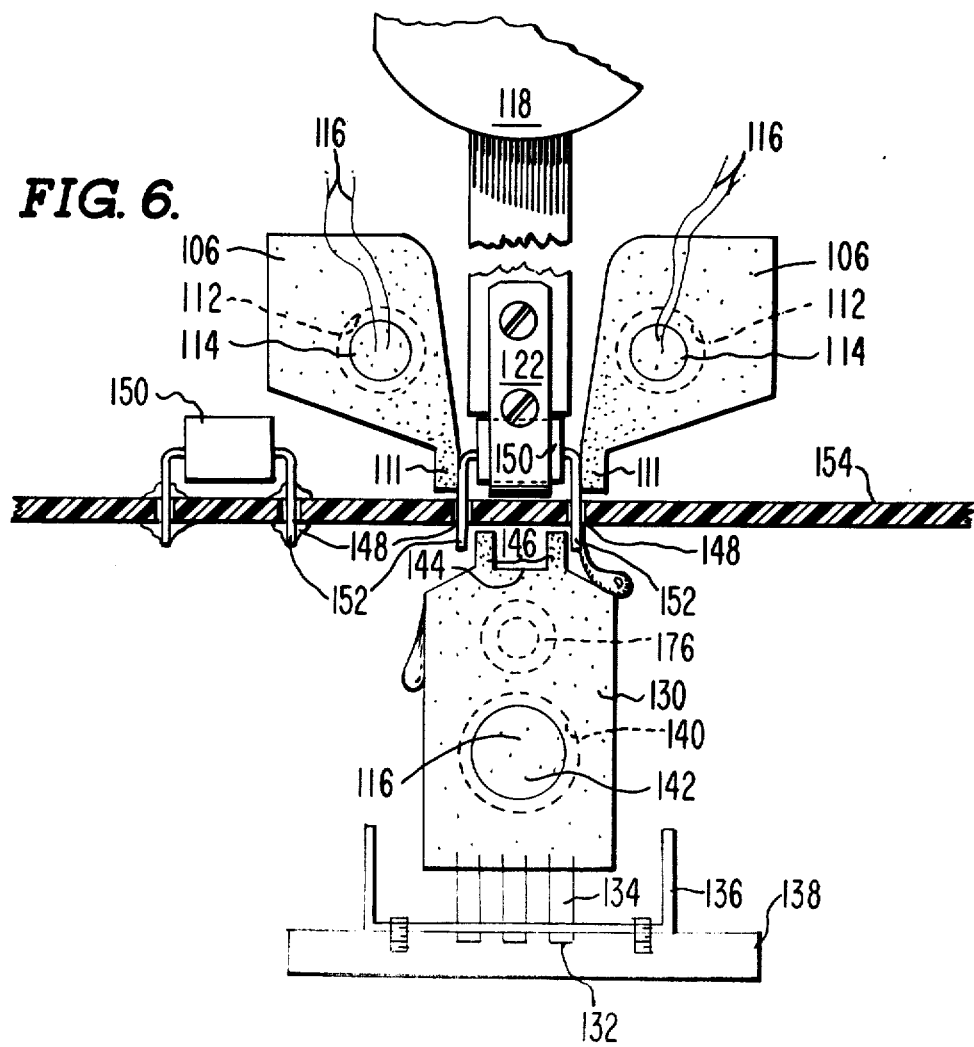

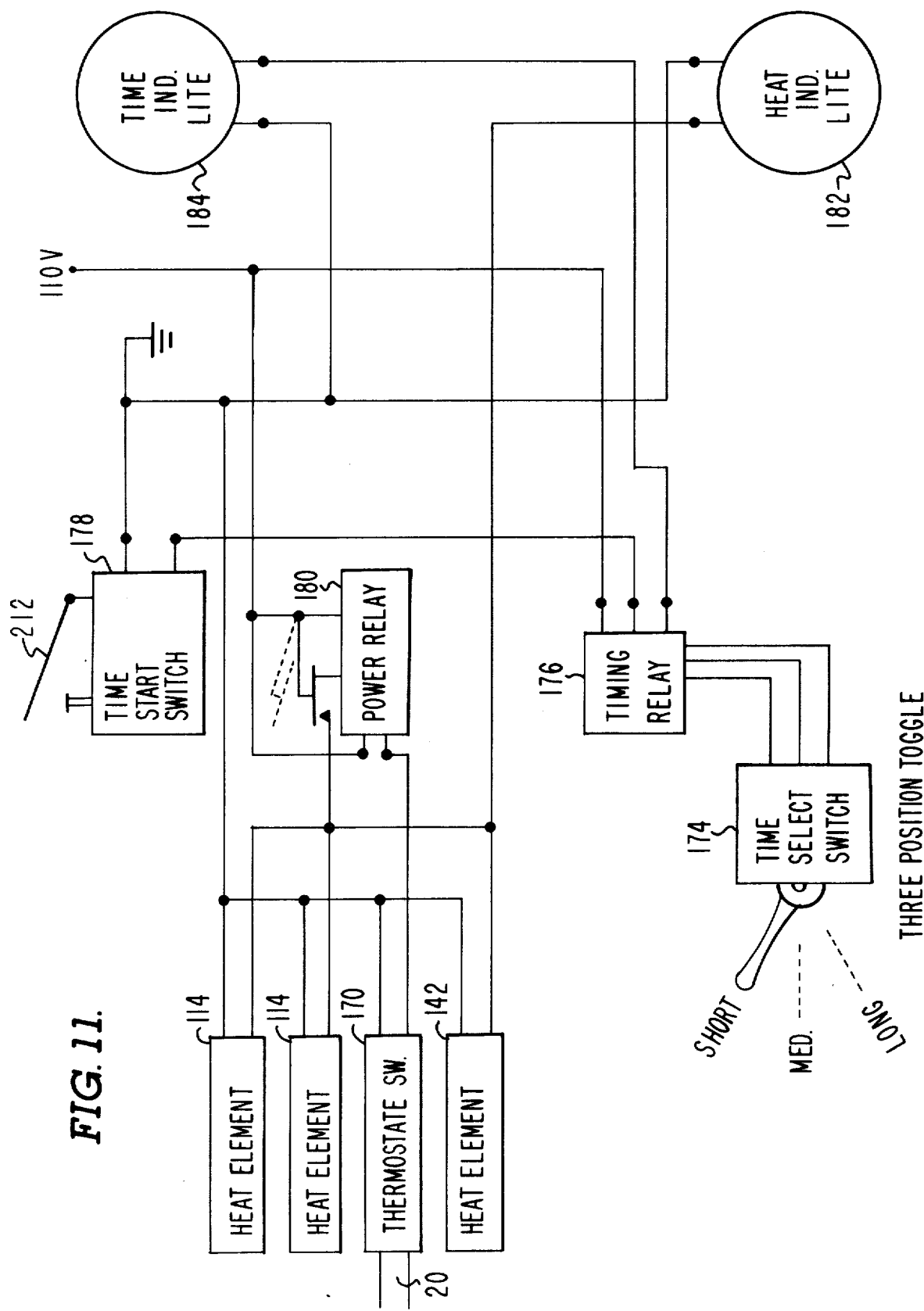

SEMIAUTOMATIC SOLID CHIP REMOVAL APPARATUS

BACKGROUND OF THE INVENTION

1. Field of the Invention

The invention relates to apparatus for dismounting DIP (dual-in-line packages) solid state chips for printed circuit panels or boards.

2. Description of the Prior Art

Prior art devices for removing chips from printed wiring panels or boards include plier-type desoldering tools which often burn or disfigure the PC board or rupture the printed wiring on the board. Hand held desoldering tools are also utilized with atomizer type members for blowing away the residual solder after the desoldering operation is completed. Semiautomatic type chip puller apparatus is generally large and bulky and often too heavy to be portable which means that the defective printed circuit boards must be accumulated and brought to the apparatus rather than bringing the apparatus to the printed circuit board for on site removal, repair or replacement. These and other problems and inefficiencies have produced a need and a ready market for a portable, hand carried, hand operated, semiautomatic device which permits an operator, on site, to remove, repair and replace the miniature DIP chips at will, efficiently and conveniently.

SUMMARY OF THE INVENTION

It is an important object therefore of the present invention to provide portable semiautomatic chip pulling apparatus which can be hand carried to the site of the needed repair and which will permit the efficient removal of the chip without the requirement for a precise or involved set-up.

Another important object of the invention is to provide a semiautomatic chip pulling apparatus which permits the utilization of a chip holding tool adaptable for varying sizes of dual-in-line circuit chips.

Still another object of the apparatus of the invention is to provide semiautomatic chip pulling apparatus wherein the apparatus is capable of utilization with a number of different degrees of heat so as to accommodate the apparatus to printed circuit boards of varying thicknesses and to DIP packages of different sizes.

These and other objects and advantages of the present invention are achieved by a semiautomatic chip pulling apparatus wherein a substantially U-shaped frame member is provided with a lower heater anvil-like member and an upper pair of parallel heater members adapted to straddle the lower member upon the introduction of the printed circuit board carrying a number of dual-in-line package chips thereon. The heaters are energized from a conventional AC supply and are regulated by thermostat which can be set for varying degrees of heat so as to accommodate varying thicknesses of printed circuit boards. The apparatus is adapted to carry a chip removing tool which can be interchanged with other tools of varying sizes for varying chip sizes. The apparatus is hand operated in the manner of a hand operated staple gun in which a spring driven element coupled to the upper heater members is loaded and cocked by the operator and thereafter moved into position whereby the heater elements straddle the chip and effectively melt the attaching solder whereupon in time relation the operator releases means which automatically extracts the chip by release of the stored spring power.

Other objects, features and advantages of the present invention will be readily apparent from the following detailed description when considered in light of the accompanying drawings, which illustrate by way of example, and not limitation, the principals of the invention and preferred modes for applying those principals.

BRIEF DESCRIPTION OF THE DRAWINGS

FIG. 1 is a side elevational view of a preferred embodiment of the present invention partly in section with the chip pulling tool in place;

FIG. 1A is an enlarged detail sectional view of the cocking linkage of the apparatus of FIG. 1;

FIG. 1B is an exploded, greatly enlarged isometric view of the driving and cocking linkage of the apparatus of FIG. 1;

FIG. 2 is a top plan view of the apparatus of FIG. 1;

FIG. 3 is a detail sectional view of the handle release linkage of the apparatus of FIG. 1;

FIG. 4 is a front elevational view of the apparatus of FIG. 1 with the chip pulling tool dismounted to show the arrangement of the upper and lower heater members;

FIG. 5 is a view similar to FIG. 4 showing the adjustability of the upper heater members relative to the lower heater members;

FIG. 6 is a greatly enlarged front elevational view of a portion of the apparatus of FIG. 1 showing a PC board in place and the upper and lower heater members positioned to desolder a DIP chip;

FIG. 11 is an electrical circuit diagram for the apparatus embodying the present invention.

DETAILED DESCRIPTION OF THE PREFERRED EMBODIMENT

Figure 7:
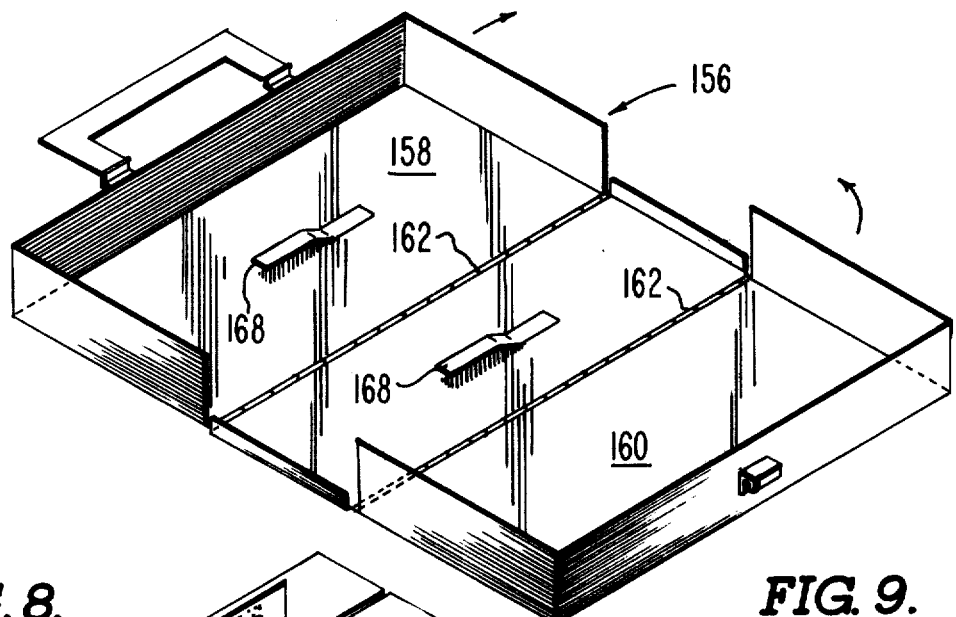
FIG. 7 is an isometric view of (not to scale) the portable carrying case for the apparatus of FIG. 1.

Portable chip pulling apparatus embodying the present invention comprises a substantially U-shaped frame member 10 (when viewed in side elevation as in FIGS. 1 and 10) formed of relatively heavy gauge sheet metal, e.g. stainless steel, as by stamping or pressing into two complementary half shell-like enclosures 10A and 10B, as seen in the top plan view of FIG. 2. Members 10A and 10B are secured together as by bolts 12 and spacer members 14 effectively providing a rigid support for the enclosed operating hardware, as will be described shortly herein.

An elongated rigid actuating drive link 16, FIGS. 1 and 1B, having a yoke-shaped forward portion is pivotally mounted for rocking moving about pivot mounting spindle 18, the latter being secured between the shell-like side wall members 10A and 10B. One end of tension spring 20 is attached to the rearward end of link 16. The opposite end of spring 20 is attached to a fixed pin 22 in the lower rear portion of frame 10. Spring 20 biases link 16 clockwise, FIG. 1, i.e. the leftward end of link 16 is biased upwardly.

The forward yoke-shaped end, FIG. 1B, of link 16 carries a pair of rollers 24—24 rotatable between the parallel yoke forming legs 26—26. Immediately rearwardly of the yoke are a pair of upwardly canted, parallel projections or tangs 28—28 (seen most clearly in FIG. 1B) for purposes to be explained presently herein. A circular clearance cutout 30 is formed in link 16 rearwardly of tangs 28—28 and adjacent to the upstanding parallel projections 28—28.

Pivotally mounted for rockable movement on a pin 32, FIG. 1A, extending between side wall members 10A and 10B is a vertically projecting latch member 34 of irregular shape as shown in FIGS. 1 and 1A. A latching notch 36 on the forward (leftward FIG. 1A) side of member 34 is engageable with the innermost projection or tangs 28, of member 16 for purposes to be described later on herein. The rightward side of member 34 is provided with a projecting tang 38 arranged to receive one end of a spring 40. The opposite end of spring 40 is received over a stud 42 projecting from a fixed member 44 in wall 10A. The upper surfaces of members 10A and 10B are each provided with rectangular openings 46 for purposes to be described presently.

An operating handle 48, FIGS. 1, 2 and 3, of U-shaped channel-construction, closed at one end, is pivotally mounted by means of a cross bolt 50 extending between two parallel upstanding supports 52—52 secured to the members 10A and 10B and projecting through rectangular openings 54—54 in the upper flat surface of these complementary shell-like members. A slidable latch release member 56, FIG. 3, is arranged to slide forwardly-rearwardly within the handle 48 by means of two bolts 58—58 and slots 60 in the latch slide member 56. A spring 62 biases the slide latch release to the forward (leftward FIG. 3) latch position. The rearward end of the slide latch release member 56 is shaped to provide a depending flat horizontal projection 63 engageable with the upstanding latch member 34 in a manner permitting the latch to move member 34 clockwise (rightwardly in FIG. 1A) as will appear more fully hereinafter.

A depending latching member 64, FIG. 1, is pivotally mounted to handle 48 by means of pin 66 and projects vertically, downwardly therefrom so as to engage the rightmost upstanding tang or projection 28 of yoke link 16. A coil spring 68 surrounding pin 66 biases latch member 64 into engagement (forwardly, clockwise in FIG. 1) with tang 28 for purposes still to be explained herein. Both of the latching members 34 and 64 project through the rectangular openings 46, previously mentioned, in members 10A and 10B to engage respective operating elements of the apparatus.

A spool roller 72 is mounted within handle 48 adjacent the leading edge of an irregularly shaped cutout 74 formed in opposite sides of handle 48 providing operating clearance for the handle as it moves arcuately about pivot cross bolt 50 to engage associated portions of the present invention.

As seen in the side elevational view of FIG. 1 and the exploded view of FIG. 1B, the forward yoke shaped end of member 16 (leftward in FIG. 1) is received within a U-shaped structure 76 with the rollers 24 straddling a forward guide rod 78. Rearward guide rod 80 is disposed between the yoke arms adjacent the apex of the yoke. Member 76 is movable vertically up and down along the two guide rods 78 and 80. The guide rods 78 and 80 are displaced slightly from each other, front to back, as seen in FIG. 1, enabling the member 76 to move smoothly vertically up and down without sidewise deflection as the handle 48 is depressed and elevated for purposes to be described shortly. The rear guide rod 80 is provided with a coiled return spring 82. The guide rods 78 and 80 are retained in vertical orientation by means of a small under cut portion 84 on each rod permitting the rod to project into and slightly through an upper shell or connecting member 86 and a bottom rigidifying member 88.

The upper and lower members 86 and 88 are secured to the respective ends of rigid plate members 90 and 92, FIG. 1B. The upper member is attached as by welding or brazing while the lower member is attached by bolts 94. Pivotally mounted on oppositely disposed pins 96 are right and left wing-like channel members 98. Each member 98 is adjustably, arcuately movable, FIGS. 4 and 5, about its respective pivot pin 96 so as to swing in sidewise direction in and out therefrom by means of a thumb screw 100 against the tension of a biasing spring 102 which tends to bias each member 98 toward the side wall of respective members 90 and 92.

As seen most clearly in FIGS. 4 and 5, the lower portion of each member 98 supports a forwardly extending elongated, T-shaped structure 104 secured thereto as by bolts (not shown) and carrying at its forward end a metallic heater member 106 secured to member 104 in stand-off relationship thereto as by means of bolts 108 and spacers 110. Right and left heater members 106—106 are irregularly shaped with the lower portion of each member terminating in a downwardly oriented projection 111, for purposes still to be described. Each heater member 106 is drilled to provide an access receptacle-like opening 112 for reception therein of a ceramic heater element 114 energizable over leads 116 from a source of AC potential (not shown).

The exposed front surface of member 76, FIG. 1B, has secured thereto, as by bolts, a mounting block 118 having a horizontally extending pin 120 projecting away therefrom providing a mounting support for a demountable DIP extractor tool 122, FIG. 1, as will be described more fully hereinafter. A vertical limit member 124 is secured to member 118 with the truncated bottom portion thereof adapted to abut a limit bolt 126 when member 118 moves from the full rest position, FIGS. 1 and 4 to the bottom position, FIG. 6, as roller 72 engages the upper surfaces of plate 80 to move the mechanism through its operating cycles, as will be described shortly. Limit 124 serves a double purpose. In the down position, it protects the printed circuit board and in the up position, it serves to raise shaft 120 sufficiently to prevent the printed circuit board from touching the lower heating element when engaging member 188 onto member 120 while positioning the printed circuit board into the machine.

Attached to the left end, FIG. 1, of the lower arm 128 of the U-shaped member 10 is a third heater member 130 secured, as by bolts 132, FIG. 6, and spacer members 134, to a supporting fixture 136 which acts to provide a front projecting support for the heater element as well as an insulating heater stand-off support member 138, FIG. 2, bolted to the front end of member 136 and extending outwardly from each side thereof a sufficient distance to prevent the apparatus from tilting sideways while in use. Heater member 130 is drilled to provide an access opening 140 for receiving a ceramic heater element 142. Heater 130 is additionally shaped as by milling to provide an upstanding ledge portion 144 and a pair of parallel raised lands 146 disposed on either side of ledge 144 and integral therewith. Heater member 130 with its oppositely disposed parallel raised land portions 146—146 provide an anvil-like mounting arrangement for supporting the printed circuit board which is to be described subsequently as used with the present invention.

Lands 146 are adapted to be received between the parallel rows of solder connections 148, FIG. 6, of each DIP chip 150 and to cooperate with the depending lands 111—111 of the upper heater members 106—106. As earlier mentioned herein, the upper heater members 106 are laterally adjustable, FIG. 5, by means of the thumb screw 100 against the tension of side springs 102 so as to permit the lands 111 to straddle the depending pins 152 of the DIP chip 150 and to bottom immediately above the top surface of the printed circuit board 154 when board 154 is mounted on the apparatus as seen in FIG. 6. The printed circuit board 154, as earlier referred to herein, is mounted so that it is supported by the upperwardly projecting lands 146 of heater member 130.

Figure 8:
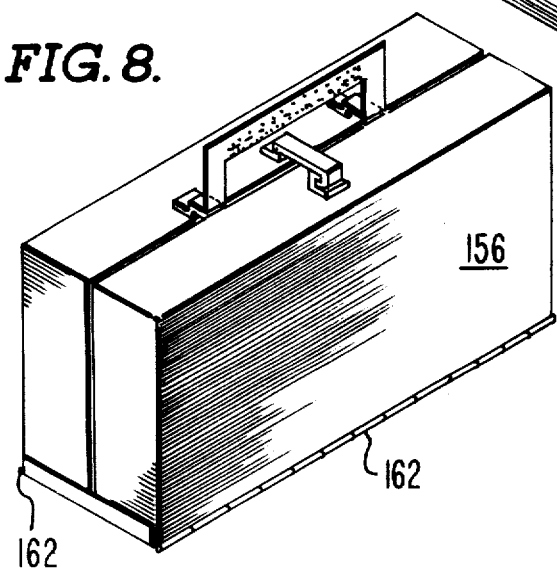
FIG. 8 is an isometric view of the case of FIG. 7 in its closed position.
Figure 9:
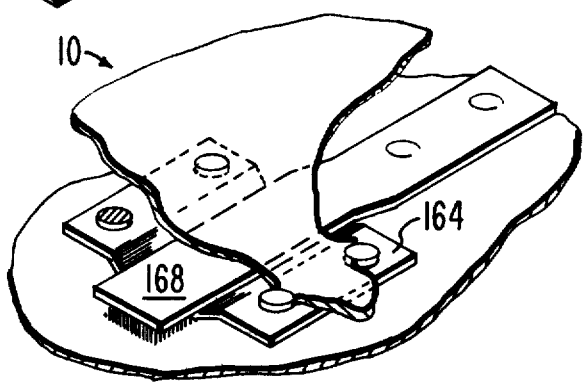
FIG. 9 is a greatly enlarged detailed view of the supporting latches of the carrying case of FIG. 7 cooperatively engaged with the bottom portion of the apparatus of FIG. 1.
Figure 10:
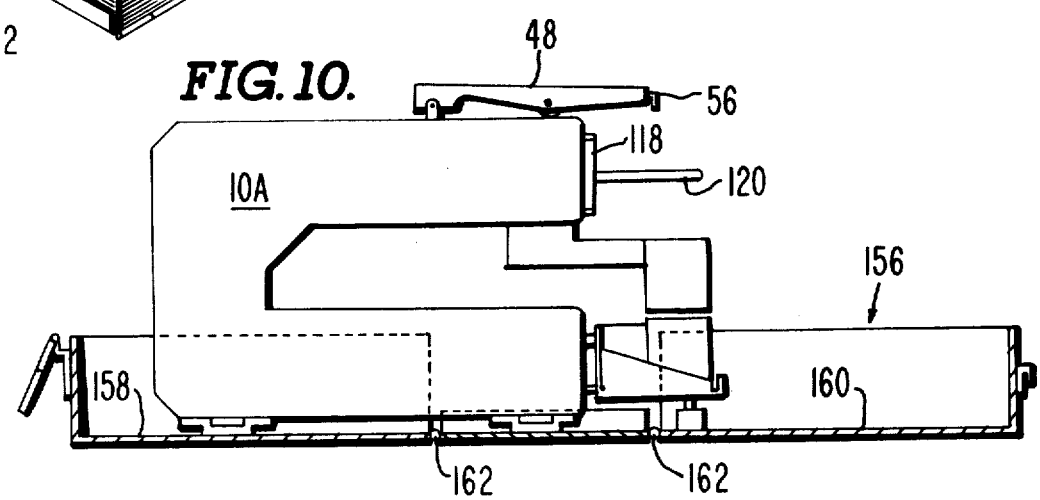
FIG. 10 is a view of the apparatus of FIG. 1 supportedly engaged with the latches of the carrying case in readiness for chip removal operation.

The apparatus embodying the present invention is sufficiently small in physical size to enable the operator to hand carry the device from job to job as the situation requires. For effecting this ease of portability a fold-up lunch pail-type carrying case 156, FIGS. 7 and 8, is provided. Side wall forming members 158 and 160 fold toward one another in the direction of the arrows along the piano hinges 162 to form the complete case 156 as seen most clearly in FIG. 7. Secured to the bottom or lower arm 128 of the apparatus are two flat U-shaped attachment hangers 164, FIG. 1, welded or otherwise mounted to the arm 128. Oppositely disposed mounting clips 168, FIGS. 7, 9 and 10, are secured, e.g. as by welding, to the bottom and one side wall 158 of the carrying case 156, FIG. 7.

When the subject apparatus is being transported or carried from job to job, the chip puller is disposed with handle 48 in the storage position (dotted outline), FIG. 1, parallel to the long dimension of the carrying case for ease of storage. In use, the device is arranged orthogonally to the long dimension of the case as seen particularly in FIG. 10. The attachment hangers 164 of the chip puller are slid under the clips 168, as in FIG. 9, so that the apparatus spans one side wall and the bottom of the case providing a rigid, substantially flat base from which to work and in addition permitting any solder droppings from the desoldered chips to be caught in the open case from which such waste material can be removed at will when cooled and solidified.

Referring to FIG. 11 which is a pictorial, schematic, wiring diagram for the apparatus of the present invention, there is shown the upper electrical heater elements 114—114-142 and the thermostat switch 170 encased in the rod-like member 172 of the lower heater member 130 for automatically controlling the temperature of the heater members 114-142—142 as set by the three position heater time select switch 174. A timing relay 176 in circuit with the toggle time select switch 174 and the time start microswitch 178 controls the application of electrical power from the 110 volt source of electrical potential through power relay 180. An "orange" heat indicator light 182 is energized after a fixed delay indicating the heater members have reached the desired temperature. A "red" time indicator light 184 is energized after the preset time has elapsed indicating that the chip has now been desoldered and can be automatically released from the printed circuit board.

The heater circuit and timing circuit are independent of each other. The heater circuit consists of heating elements, power relay, thermostat and indicator light. The power relay is operated by the thermostat. It supplies current to the heaters controlling the temperature of the heating elements. The light "off" indicates elements are at proper temperature. The timing circuit includes time start microswitch 178, timing relay 176, time select toggle switch 174 and time indicator light 184.

OPERATION

While the apparatus is cool, the operator adjusts the heater members 106—106 to suit the width of the particular DIP chip 150 being desoldered from PC board 154. The DIP extractor tool 122, as seen most clearly in FIG. 1, comprises a rigid member 186 supported at its upper extremity by a dielectric high-heat-resistant block 188 having a mounting aperture 190 therethrough enabling the tool to be demountably securable (for removal and replacement) relative to the forwardly extending post 120 of the apparatus. The lower enlarged portion 192 of tool 122 carries on one side a fixed tang 194, the lowermost end of which is bent inwardly as at 196. Pivotally mounted by means of pin 198 to hinge posts 200 on the opposite side of member 192 is a movable tang 202 inwardly bent as at 204 and rockable toward and away from tang 194 by means of heat resistant handle 206 against the bias of spring 208. The span or gap between the two tangs when in the distended condition shown in FIG. 1 is equivalent to the length of the particular chip being desoldered from the PC board.

With the tangs 194 and 202 gripping a chip 150, the tool 122 carrying the PC board 154 is slid into the open area of the U-shaped frame as shown so as to mount the tool 122 in place on post 120. The upper heater members 106—106 are laterally adjusted to accommodate the chip width while centering the upper heater members over the lower heater member 130, FIG. 5, so as to position the assembly centrally as seen in FIG. 6.

The equipment is plugged into the 110 volt electrical potential source and heat time switch 174 is set to one of the three positions depending upon the thickness of the PC board and the mass of the conductor paths on the board. The temperature indicator light (orange) 182 comes on immediately and remains lit until the heater members are up to temperature when the light 182 goes out.

Swing arm or handle 48 is now moved downwardly with the latch member 64 inserted in the near aperture 46, FIG. 1, to bring the notch 65 in the latch 64 into engagement with the nearside upstanding tang 28 on link 16. The handle is pressed further downwardly until the inboard tang 28 of link 16 falls into the notch 36 of latch 34, (the latter being pressed leftwardly by spring 40), FIG. 1A, latching the link 16 in a slightly downward position. This cocks the extraction mechanism. The swing arm 49 is now raised approximately 30°— sufficiently to allow latch 64 to disengage from tang 28 and swing counterclockwise (it is weighted to do so by gravity) until it comes to rest against microswitch bracket 212. Thereafter arm 48 is pressed downwardly to abut the top of member 86 causing the downward end of latch 64 to engage the actuator 214 of switch 178 closing the switch and bringing the heating elements in contact with the PC boards.

The time switch 174 is now set for the PC board thickness desired (e.g. "short" for two layer boards). Flux is applied to the PC board around the soldered area and the chip component which is to be removed. With the chip removal tool 122 now clamping the chip 150, the handle 48 is pressed downwardly as far as possible. This movement brings the rightward edge 210 of the latch 64 into sliding contact with the actuator 214 of microswitch 178 starting the timed cycle. At the moment the (red) light 184 goes out and with continued downward pressure on handle 48, release 56 on handle 48 is pressed inwardly causing tang 63 on the handle slide to move the upstanding end of latch 34 rearwardly disengaging notch 36 from the tang 28 enabling spring 20 to flip the link 16 arcuately, vertically, upwardly about pivot 18. Rollers 24, FIGS. 1 and 1B, abutting the lower interior of member 76, FIG. 1B, which carries the chip detaching tool 122, now moves quickly upwardly disengaging the desoldered chip from the PC board 154. The residual solder, if any, can then be tapped out resulting in a clear, clean board area for the introduction therein of a fresh component.

What is claimed is:

1. Portable semiautomatic apparatus for removing dual-in-line solid state chip packages from associated hardware such for example as a printed circuit board comprising:
   a frame member providing a support for said apparatus,
   first heater means carried by said support providing an anvil for supporting a printed circuit board thereon,
   second heater means arranged to straddle said associated means for moving said second heater means toward and away from said first heater means,
   means movable relative to said first and second heater means for mounting a chip holding and extracting member thereon,
   means for electrically energizing said heater means so as to release said chip from said printed circuit board, and
   means for driving said chip holding and extracting member in one direction to lower said chip carrying tool toward said first heater means and said printed circuit board and for moving said chip carrying tool in the opposite direction to pull said released chip out away from said printed circuit board upon its release therefrom.

2. The invention in accordance with claim 1 wherein said frame member is substantially U-shaped with said heater members disposed at the terminal open ends of the U.

3. The invention in accordance with claim 1 wherein said first heater means further includes a thermostatic control for regulating the temperature of said heater means.

4. The invention in accordance with claim 1 wherein said second heater means includes means for laterally adjusting the spacing between heater elements relative to said first heater means.

5. The invention in accordance with claim 1 wherein said chip holding and extracting member comprises a demountable tool having movable clamping means engaging a DIP chip and slidably received on said mounting means.

6. The invention in accordance with claim 1 wherein said means for energizing said heater means further includes means for varying the level of applied heat and for visually indicating to the operator that the prescribed heat level has been attained.

7. The invention in accordance with claim 1 wherein said means for driving said chip holding and extracting member comprises a spring for storing energy, a latch coupled to said spring and said chip holding and extracting member and a quick release means engaging said spring for releasing said stored energy so as to move the chip from the printed circuit board after the release temperature has been attained.

* * * * *